United States Patent
Shimoda et al.

(10) Patent No.: US 10,802,073 B2
(45) Date of Patent: Oct. 13, 2020

(54) PATTERN DEFECT DETECTION METHOD

(71) Applicant: TASMIT, Inc., Yokohama (JP)

(72) Inventors: Ryo Shimoda, Yokohama (JP); Kotaro Maruyama, Yokohama (JP)

(73) Assignee: TASMIT, INC., Yokohama (JP)

(*) Notice: Subject to any disclaimer, the term of this patent is extended or adjusted under 35 U.S.C. 154(b) by 146 days.

(21) Appl. No.: 16/013,232

(22) Filed: Jun. 20, 2018

(65) Prior Publication Data

US 2019/0025371 A1    Jan. 24, 2019

(30) Foreign Application Priority Data

Jun. 23, 2017 (JP) .................. 2017-123092

(51) Int. Cl.
| | |
|---|---|
| G03F 7/20 | (2006.01) |
| G06T 7/00 | (2017.01) |
| G01R 31/307 | (2006.01) |
| G01N 21/95 | (2006.01) |
| G01N 21/956 | (2006.01) |

(52) U.S. Cl.
CPC ....... G01R 31/307 (2013.01); G01N 21/9505 (2013.01); G01N 21/95607 (2013.01); G03F 7/70625 (2013.01); G06T 7/001 (2013.01); G01N 2021/95615 (2013.01); G06T 2207/30148 (2013.01)

(58) Field of Classification Search
None
See application file for complete search history.

(56) References Cited

U.S. PATENT DOCUMENTS

2017/0115232 A1* 4/2017 Sullivan ............ G01N 21/8806

FOREIGN PATENT DOCUMENTS

| JP | 2001-338304 A | 12/2001 |
|---|---|---|
| JP | 2011-071268 A | 4/2011 |

* cited by examiner

*Primary Examiner* — Idowu O Osifade
(74) *Attorney, Agent, or Firm* — Lathrop GPM LLP

(57) ABSTRACT

A pattern defect detection method capable of detecting a pattern defect of a semiconductor integrated circuit with higher accuracy is disclosed. The pattern defect detection method includes: extracting an image of an inspection target pattern from an image of a specimen; identifying a reference pattern from design data, the reference pattern having the same shape and the same position as those of the inspection target pattern; calculating a brightness index value indicating a brightness of an entirety of the inspection target pattern; repeating said extracting an inspection target pattern, said identifying a reference pattern, and said calculating a brightness index value, thereby building mass data containing brightness index values of inspection target patterns and corresponding reference patterns; determining a standard range of brightness index value based on the brightness index values contained in the mass data; and detecting a defect of the inspection target pattern based on whether or not the calculated brightness index value is within the standard range.

4 Claims, 8 Drawing Sheets

First group

Second group

PATTERN DEFECT DETECTION METHOD

CROSS REFERENCE TO RELATED APPLICATION

This document claims priority to Japanese Patent Application No. 2017-123092 filed Jun. 23, 2017, the entire contents of which are hereby incorporated by reference.

BACKGROUND

One example of a method of inspecting a defect of interconnects in a semiconductor integrated circuit is an inspection method using a voltage contrast using a scanning electron microscope. This technique utilizes the fact that a brightness of a pattern on an SEM image decreases when there is an open defect or a short defect in an interconnect underlying the pattern. In this method, an SEM image of a non-defective product and an SEM image of the inspection target pattern are compared with each other to thereby detect an interconnect defect.

FIG. 9 is a schematic view showing an SEM image including a non-defective contact hole and a defective contact hole. As shown in FIG. 9, a brightness of a defective contact hole 601 is lower than that of a non-defective contact hole 600. According to the above method, it is possible to detect a defect based on a reduction in the brightness of the contact hole.

However, in the interconnect defect inspection using the voltage contrast, the reliability of inspection depends on a method of generating the image of the non-defective product to be used and the image of the inspection target pattern. Thus, various methods for image generation have been proposed. For example, Japanese Laid-Open Patent Publication No. 2011-71268 discloses a technique in which design data of an inspection target is used to generate an image of a non-defective product so that the voltage contrast can be applied even when there is no non-defective product.

Meanwhile, there is a method called die-to-database comparison that can be applied to a pattern inspection of a semiconductor integrated circuit using design data. This is a method of detecting a defect by comparing an image of a semiconductor integrated circuit to be inspected, which is called a die, with a reference image created from design data of the semiconductor integrated circuit (see, for example, Japanese Laid-Open Patent Publication No. 2001-338304).

However, in the above-described method using design data for creating an image of a non-defective product, the pattern defect detection is not correctly performed if there is a variation in the brightness of non-defective products. Further, since the positions of the pattern edges are compared in the die-to-database comparison, it is impossible to detect a defect based on the brightness of the pattern.

SUMMARY OF THE INVENTION

Therefore, according to an embodiment, there is provided a pattern defect detection method capable of detecting a pattern defect of a semiconductor integrated circuit with higher accuracy.

Embodiments, which will be described below, relate to a method of detecting a defect of a pattern, such as contact hole or interconnect, and more specifically, a method of detecting a defect of a pattern, constituting a semiconductor integrated circuit (LSI) or a liquid crystal panel, manufactured based on design data.

In an embodiment, there is provided a pattern defect detection method comprising: generating an image of a specimen with a scanning electron microscope; extracting an image of an inspection target pattern from the image of the specimen; identifying a reference pattern from design data, the reference pattern having the same shape and the same position as those of the inspection target pattern; calculating a brightness index value indicating a brightness of an entirety of the inspection target pattern; repeating said extracting an inspection target pattern, said identifying a reference pattern, and said calculating a brightness index value, thereby building mass data containing brightness index values of inspection target patterns and corresponding reference patterns; determining a standard range of brightness index value based on the brightness index values contained in the mass data; and detecting a defect of the inspection target pattern based on whether or not the calculated brightness index value is within the standard range.

In an embodiment, the brightness index value is one selected from a maximum value, a minimum value, a median, an average, and a 3-sigma of brightness levels of all pixels in a region surrounded by edges of the inspection target pattern.

In an embodiment, the pattern defect detection method further comprises classifying the inspection target patterns contained in the mass data into groups based on information of the reference patterns contained in the mass data, wherein determining the standard range comprises determining a standard range for each of the groups based on brightness index values contained in the mass data, and detecting the defect of the inspection target pattern comprises detecting a defect of the inspection target pattern based on whether or not a brightness index value that has been calculated for the inspection target pattern is within the standard range that has been determined for a group to which that inspection target pattern belongs.

In an embodiment, the information of the reference patterns includes at least one of the number of each reference pattern, a shape of each reference pattern, and presence or absence of connection of an underlying interconnect.

According to the above-described embodiments, the standard range is determined using the mass data of the brightness index value, and each brightness index value is compared with the standard range. By using such mass data, the defect inspection of the semiconductor integrated circuit with the voltage contrast can be performed with higher accuracy.

DESCRIPTION OF EMBODIMENTS

Hereinafter, embodiments will be described in detail with reference to the drawings.

Figure 1:
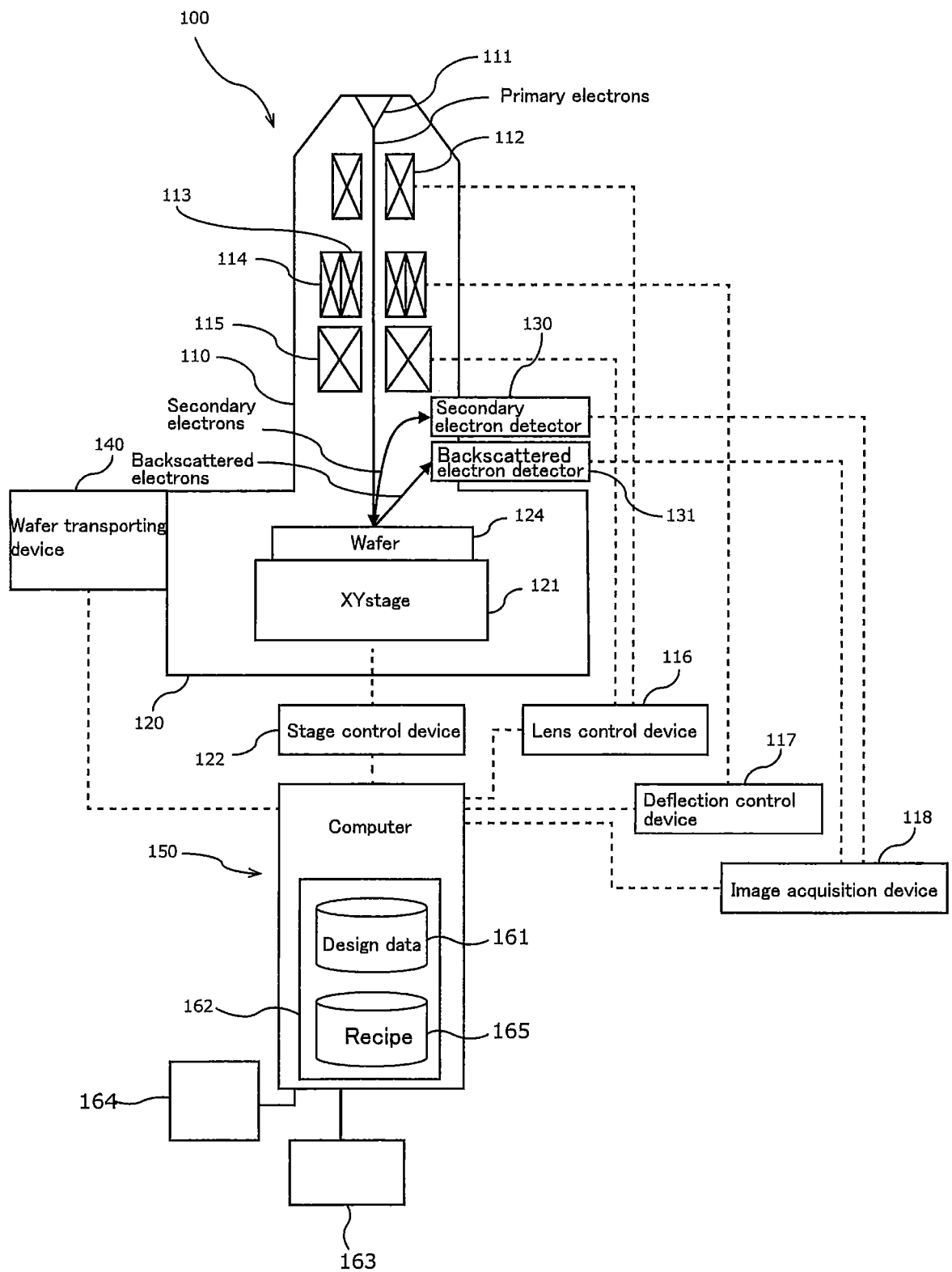
FIG. 1 is a schematic diagram showing an embodiment of a pattern defect detection apparatus including a scanning electron microscope.

FIG. 1 is a schematic diagram showing an embodiment of a pattern defect detection apparatus including a scanning electron microscope. As shown in FIG. 1, the pattern defect detection apparatus includes a scanning electron microscope 100 and a computer 150 for controlling operations of the scanning electron microscope. The scanning electron microscope 100 includes an electron gun 111 that emits an electron beam composed of primary electrons (charged particles), a converging lens 112 that converges the electron beam emitted from the electron gun 111, an X deflector 113 that deflects the electron beam in an X direction, a Y deflector 114 for deflecting the electron beam in a Y direction, and an objective lens 115 for focusing the electron beam on a wafer 124 which is a specimen.

The converging lens 112 and the objective lens 115 are coupled to a lens control device 116, and operations of the converging lens 112 and the objective lens 115 are controlled by the lens control device 116. This lens control device 116 is coupled to the computer 150. The X deflector 114 and the Y deflector 115 are coupled to a deflection control device 117, and deflection operations of the X deflector 113 and the Y deflector 114 are controlled by the deflection control device 117. This deflection control device 117 is also coupled to the computer 150. A secondary electron detector 130 and a backscattered electron detector 131 are coupled to an image acquisition device 118. This image acquisition device 118 is configured to convert output signals of the secondary electron detector 130 and the backscattered electron detector 131 into an image. This image acquisition device 118 is also coupled to the computer 150.

An XY stage 121 is disposed in a specimen chamber 120. This XY stage 121 is coupled to a stage control device 122, so that the position of the XY stage 121 is controlled by the stage control device 122. This stage control device 122 is coupled to the computer 150. A wafer transporting device 140 for placing the wafer 124 onto the XY stage 121 in the specimen chamber 120 is also coupled to the computer 150. The computer 150 includes a memory 162 in which a design database 161 is stored, an input device 163 such as a keyboard and a mouse, and a display device 164.

The electron beam emitted from the electron gun 111 is converged by the converging lens 112, and is then focused by the objective lens 115 onto the surface of the wafer 124, while the electron beam is deflected by the X deflector 113 and the Y deflector 114. When the wafer 124 is irradiated with the primary electrons of the electron beam, secondary electrons and backscattered electrons are emitted from the wafer 124. The secondary electrons are detected by the secondary electron detector 130, and the backscattered electrons are detected by the backscattered electron detector 131. The signals of the detected secondary electrons and the signals of the backscattered electrons are input into the image acquisition device 118, and are converted into image data. The image data is transmitted to the computer 150, and an image of the wafer 124 is displayed on the display device 164 of the computer 150.

A design data (including design information, such as dimensions of patterns) of the wafer 124 is stored in advance in the memory 162. In the memory 162, the design database 161 and a recipe database 165 are constructed. The design data of the wafer 124 is stored in advance in the design database 161. The computer 150 can retrieve the design data of the wafer 124 from the design database 161 stored in the memory 162. Information necessary for performing the pattern defect detection is stored as a recipe in the recipe database 165 in advance. The pattern defect detection apparatus operates according to this recipe.

Figure 2:
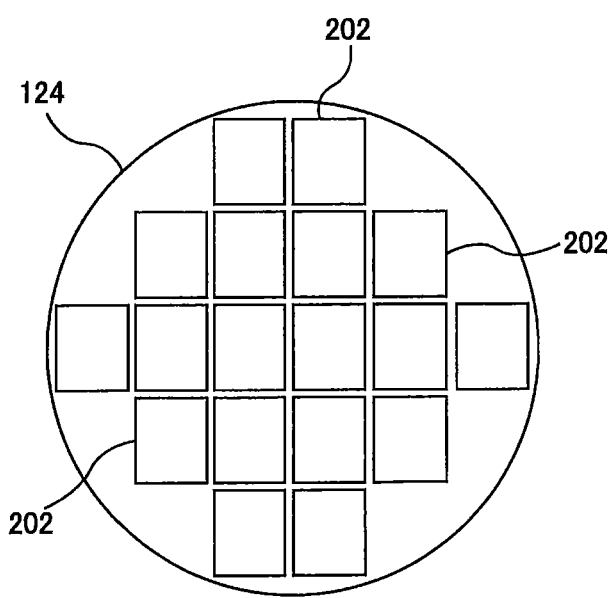
FIG. 2 is a schematic diagram showing a wafer as a specimen.
Figure 3:
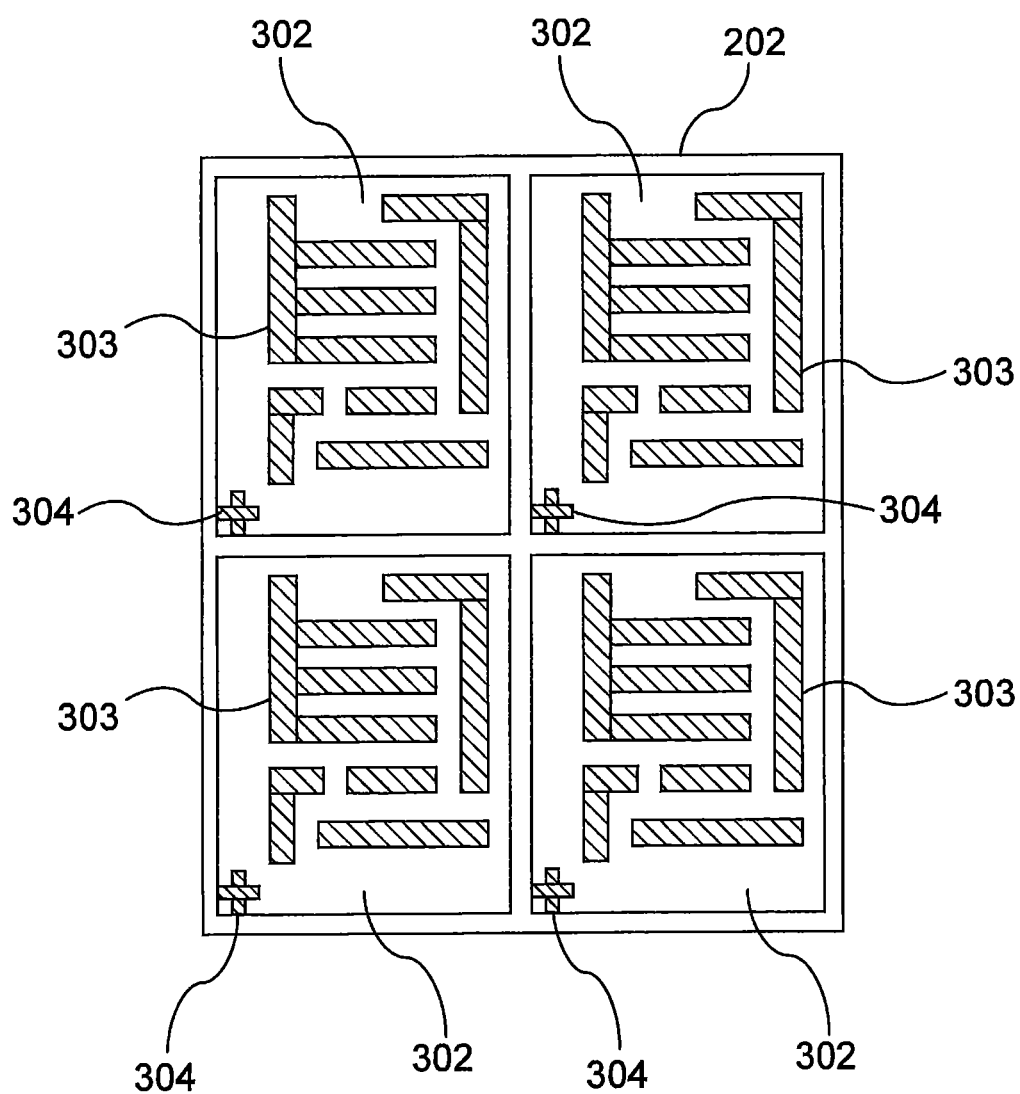
FIG. 3 is a schematic diagram showing a shot containing a plurality of chips.

The wafer 124 will be described with reference to FIGS. 2 and 3. A plurality of shots 202 are formed on the wafer 124. Each shot 202 is a unit for drawing photoresist patterns on the wafer 124. The photoresist patterns are used for processing a semiconductor device. As shown in FIG. 3, each shot 202 can include a plurality of chips 302. A pattern 303 is formed in each chip 302. A pattern formed on the lower left side of the chip 302 can be used as a reference pattern 304. An image of the reference pattern 304 can be used for alignment of the wafer 124.

The design data is a design diagram of plural types of patterns, such as interconnect, contact hole, gate, and transistor. The design data includes shape information and position information of the pattern 303 in the chip 302. In a manufacturing process of a semiconductor device, pattern processing is performed on several tens of multilayered films. Therefore, the design data includes data of several tens of layers.

Figure 4:
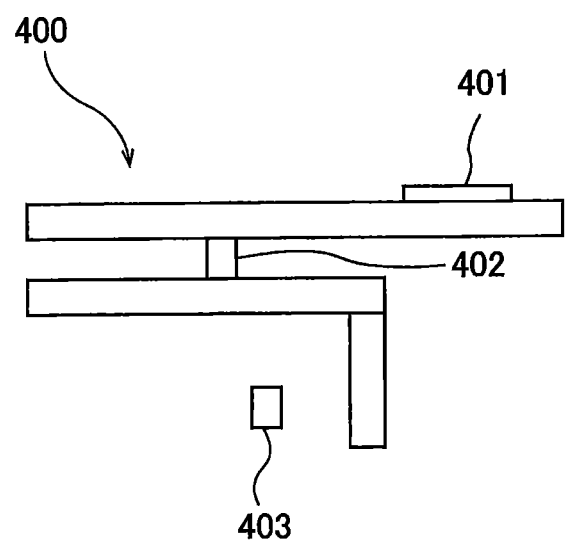
FIG. 4 is a schematic diagram of an inspection target pattern.
Figure 5:
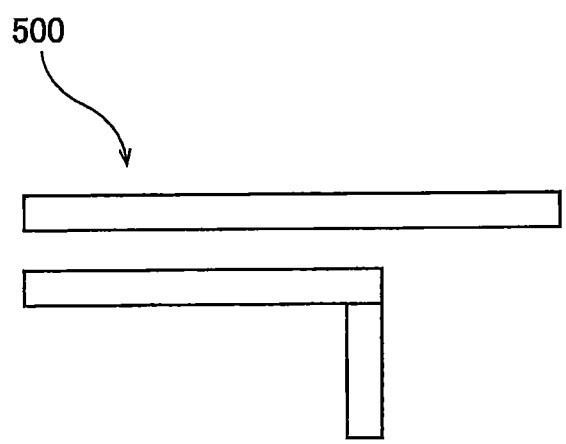
FIG. 5 is a schematic diagram of a reference pattern.

The pattern defect detection apparatus according to this embodiment generates an image of a wafer including an inspection target pattern (for example, as shown in FIG. 4, a pattern 400 including defects 401, 402, and 403), extracts an image of the inspection target pattern from the image of the wafer, and compares the image of the inspection target pattern with a reference pattern (for example, a pattern 500 as shown in FIG. 5) obtained from the design data.

More specifically, the computer 150 detects edges from the image of the inspection target pattern. Next, the computer 150 compares the detected edges with edges of a reference pattern so as to perform matching between the image of the inspection target pattern and the reference pattern. This matching is a process of identifying a reference pattern having the same shape and the same position as those of the inspection target pattern. Various information of the reference pattern, such as the layer number, the shape information (dimensions and vertex positions of the pattern, etc.), the presence or absence of underlying interconnect, are included in the design data. Therefore, various information of the inspection target pattern corresponding to the reference pattern, such as the layer number, shape information, the presence or absence of underlying interconnect, can be specified from the design data.

Figure 6:
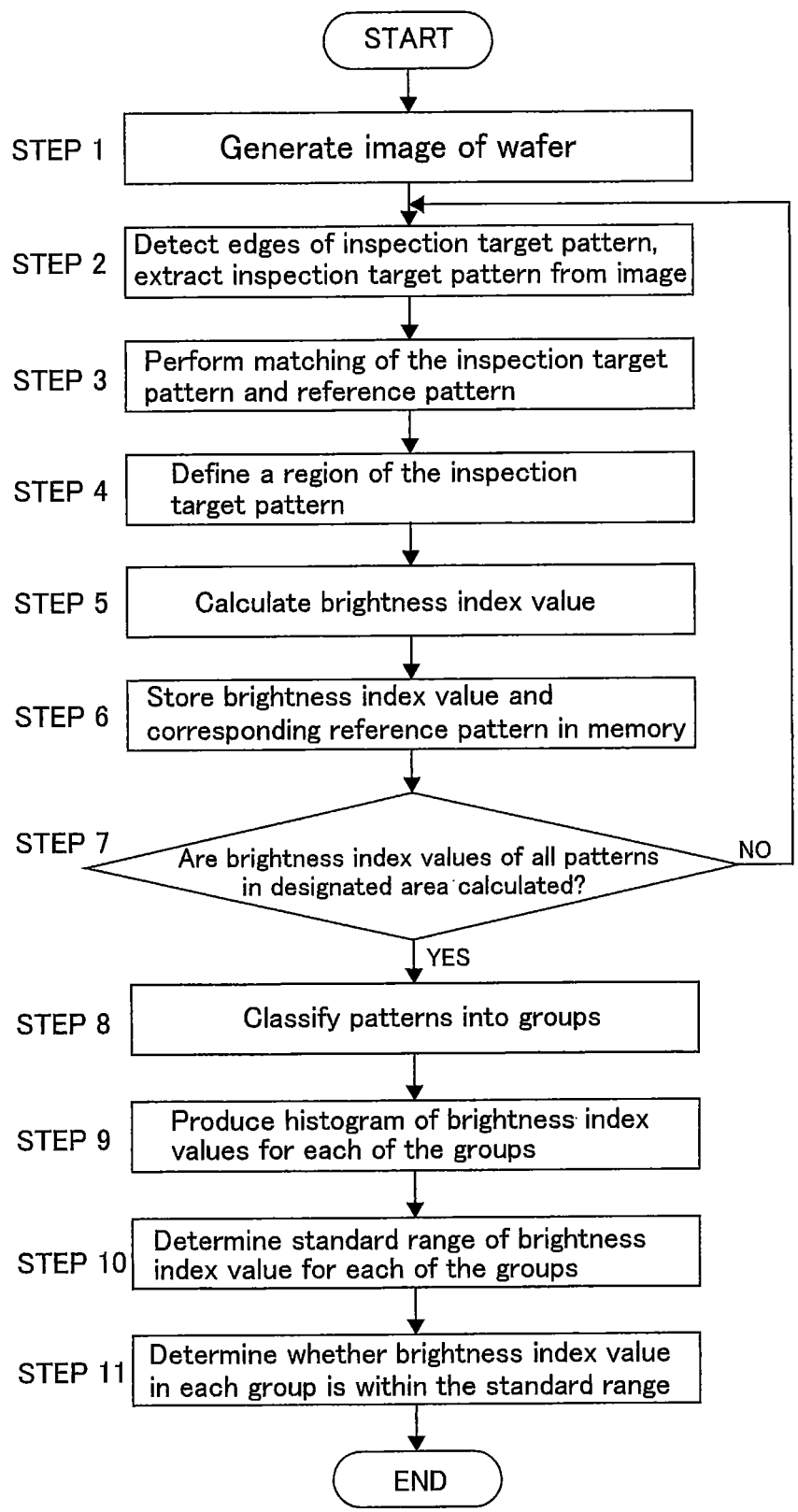
FIG. 6 is a flowchart showing an embodiment of a pattern defect detection method.

An embodiment of a pattern defect detection method executed using the above-described pattern defect detection apparatus will be described below with reference to a flowchart shown in FIG. 6. In step 1, the computer 150 instructs the scanning electron microscope 100 to generate an image of the wafer 124 on which an inspection target pattern is formed. The computer 150 obtains the generated image from the scanning electron microscope 100. In step 2, the computer 150 extracts the inspection target pattern from the image by detecting edges of the inspection target pattern on the generated image. In step 3, the computer 150 compares the detected edges with edges of a reference pattern to thereby perform matching of the image of the inspection target pattern and the reference pattern.

In step 4, the computer 150 defines (or identifies) a region of the inspection target pattern as a region surrounded by the detected edges. In step 5, the computer 150 calculates a brightness index value, indicating a brightness of the entirety of the inspection target pattern, from brightness levels (e.g., gray levels) of pixels in the region of the inspection target pattern defined in the step 4. The brightness index value is one selected from a maximum value, a minimum value, a median, an average, and a 3-sigma of the brightness levels of the pixels in the inspection target pattern. In step 6, the computer 150 stores the calculated brightness index value of the inspection target pattern and information of the reference pattern corresponding to the inspection target pattern in the memory 162. The reference pattern corresponding to the inspection target pattern means a reference pattern having the same shape and the same position as those of the inspection target pattern.

The pattern defect detection apparatus operates according to a recipe stored in advance in the recipe database 165. The recipe includes a designated area in which the pattern defect inspection is to be performed. Therefore, the pattern defect detection apparatus calculates brightness index values of all of inspection target patterns within the designated area specified in the recipe. In step 7, the computer 150 determines whether the brightness index values of all the inspection target patterns within the designated area have been calculated. If the brightness index values of all the inspection target patterns within the designated area have not been calculated, the computer 150 repeats the processing flow from the step 2 to the step 6.

As a result of repeating the processing flow from the step 2 to the step 6, mass data is built in the memory 162. The mass data includes a plurality of brightness index values of a plurality of inspection target patterns and a plurality of reference patterns corresponding to the plurality of inspection target patterns. The information of the plurality of reference patterns includes pattern identification factors, such as the layer number of each reference pattern, the shape of each reference pattern, and the presence or absence of connection of an underlying interconnect. The layer number is the number of the layer in which the reference pattern is located. The shape of the reference pattern is shape-specifying factors including dimensions and vertex positions of the reference pattern. The presence or absence of the connection of the underlying interconnect is a connection condition indicating whether or not the reference pattern is connected to the underlying interconnect.

The above-described mass data may further include brightness index values of a plurality of inspection target patterns that have been obtained in the past in other wafers having the same structure as the wafer to be inspected, and information of a plurality of reference patterns corresponding to those inspection target patterns.

In step 8, the computer 150 classifies the inspection target patterns into a plurality of groups based on the information of the reference patterns contained in the mass data. More specifically, the computer 150 classifies the inspection target patterns according to the pattern identification factors (e.g., the layer number, the shape, the presence or absence of the connection of the underlying interconnect) of the reference patterns corresponding to the inspection target patterns. For example, inspection target patterns, whose corresponding reference patterns have the same layer number, the same shape, and the same state as to presence or absence of the connection of the underlying interconnect, are classified into the same group. In another example, inspection target patterns, whose corresponding reference patterns have the same layer number and the same state as to presence or absence of the connection of the underlying interconnect, but have different shapes, are classified into the same group.

Figure 7:
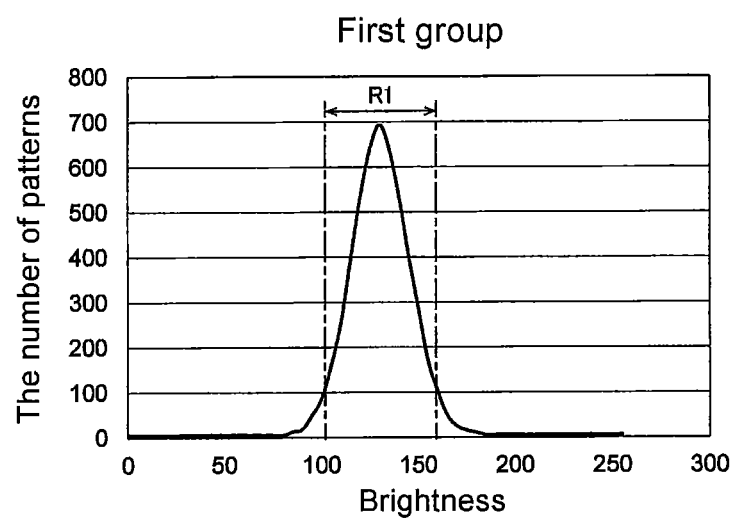
FIG. 7 is a histogram of brightness index values.
Figure 7:
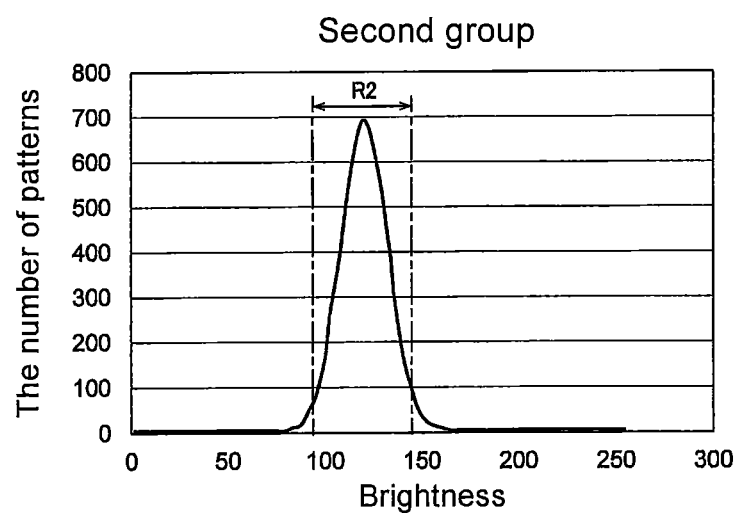

In step 9, the computer 150 produces a histogram of the brightness index values for each of the groups. Specifically, the computer 150 produces a histogram of the brightness index values of the inspection target patterns belonging to each group. FIG. 7 shows a histogram of the brightness index values of inspection target patterns belonging to a first group, and a histogram of brightness index values of inspection target patterns belonging to a second group. A vertical axis of the histogram represents the number of inspection target patterns, and a horizontal axis represents brightness (e.g., gray level). As can be seen from FIG. 7, the shape of the histogram varies from group to group. The computer 150 may display the created histogram on the display device 164.

In step 10, the computer 150 determines a standard range of brightness index value for each of the groups, based on a plurality of brightness index values of a plurality of inspection target patterns belonging to each group. In one embodiment, the computer 150 determines a standard range of brightness index value in each of the groups based on an average of a plurality of brightness index values of a plurality of inspection target patterns belonging to each group. In the example shown in FIG. 7, the computer 150 determines a standard range R1 including an average of a plurality of brightness index values of a plurality of inspection target patterns belonging to the first group, and determines a standard range R2 including an average of a plurality of brightness index values of a plurality of inspection target patterns belonging to the second group.

In step 11, the computer 150 determines whether the brightness index value of each inspection target pattern is within the standard range that has been determined for the group to which that inspection target pattern belongs. In the example shown in FIG. 7, the computer 150 determines whether a brightness index value of an inspection target pattern belonging to the first group is within the corresponding standard range R1, and determines whether a brightness index value of an inspection target pattern belonging to the second group is within the corresponding standard range R2. Further, if a brightness index value of a certain inspection target pattern belonging to the first group is not within the standard range R1, the computer 150 determines that there is a defect in that inspection target pattern. Similarly, if a brightness index value of a certain inspection target pattern belonging to the second group is not within the standard range R2, the computer 150 determines that there is a defect in that inspection target pattern. According to the present embodiment, the standard range is set for each of the groups, and the computer 150 detects a defect of an inspection target pattern with use of the standard range determined for the group to which that inspection target pattern belongs. The computer 150 stores the result of the defect detection in the memory 162, and further displays the result of the defect detection on the display device 164.

As shown in FIG. 7, since the shape of the histogram varies from group to group, the standard range also varies from group to group. According to the present embodiment, since the inspection target patterns are classified based on the information of the corresponding reference patterns and the standard ranges are determined for each of the groups, the computer 150 can accurately detect a defect of an inspection target pattern.

Figure 8:
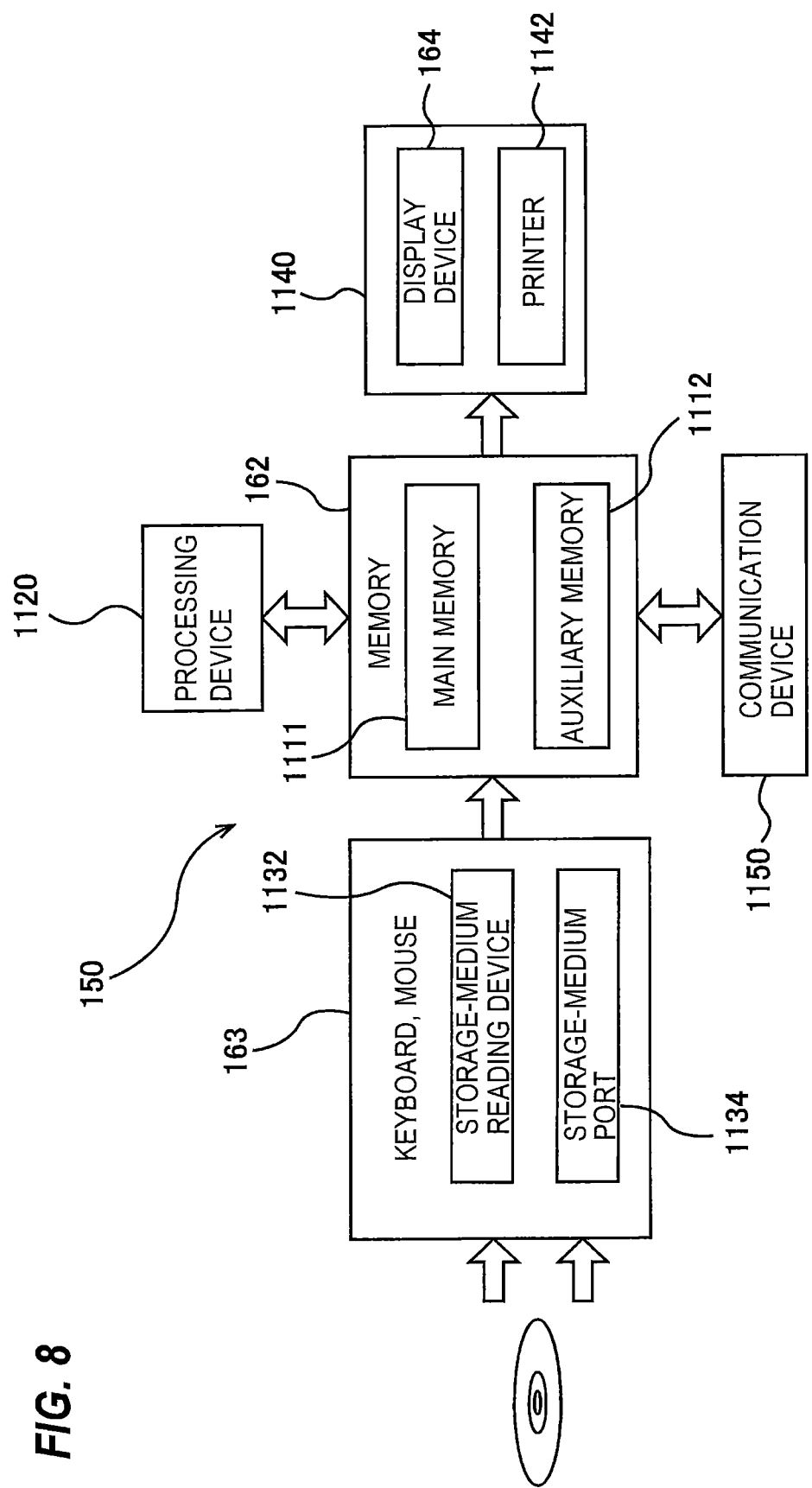
FIG. 8 is a schematic diagram of showing a configuration of a computer.
Figure 9:
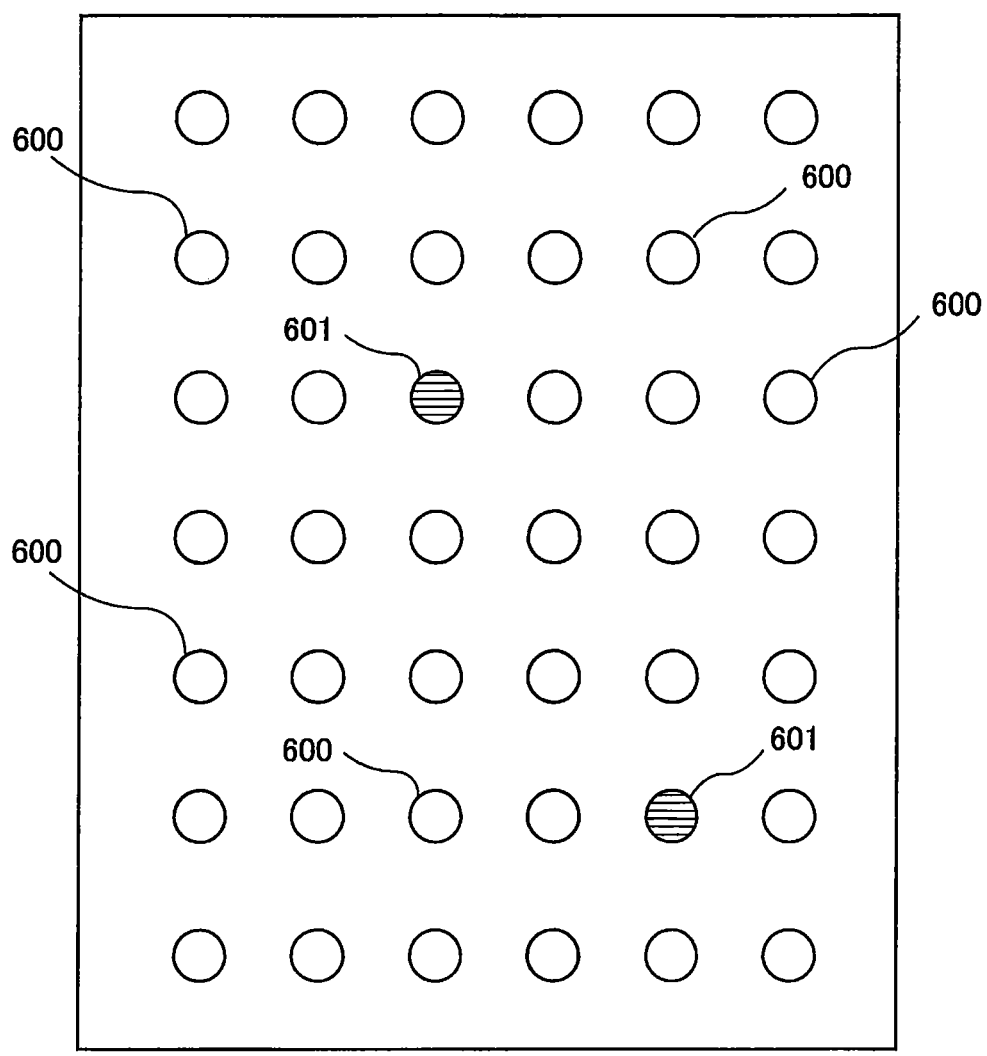
FIG. 9 is a schematic view showing an SEM image including a non-defective contact hole and a defective contact hole.

FIG. 8 is a schematic diagram showing the configuration of the computer 150. The computer 150 includes the memory 162 in which a program and data are stored, a processing device 1120, such as CPU (central processing unit), for performing arithmetic operation according to the program stored in the memory 162, the input device 163 for inputting the data, the program, and various information into the memory 162, an output device 1140 for outputting processing results and processed data, and a communication device 1150 for connecting to a network, such as the Internet.

The memory 162 includes a main memory 1111 which is accessible by the processing device 1120, and an auxiliary memory 1112 that stores the data and the program therein. The main memory 1111 may be a random-access memory (RAM), and the auxiliary memory 1112 is a storage device which may be a hard disk drive (HDD) or a solid-state drive (SSD).

The input device 163 includes a keyboard and a mouse, and further includes a storage-medium reading device 1132 for reading the data from a storage medium, and a storage-medium port 1134 to which a storage medium can be connected. The storage medium is a non-transitory tangible computer-readable storage medium. Examples of the storage medium include optical disk (e.g., CD-ROM, DVD-ROM) and semiconductor memory (e.g., USB flash drive, memory card). Examples of the storage-medium reading device 132 include optical disk drive (e.g., CD drive, DVD drive) and card reader. Examples of the storage-medium port 1134 include USB terminal. The program and/or the data stored in the storage medium is introduced into the computer 150 via the input device 163, and is stored in the auxiliary memory 1112 of the memory 162. The output device 1140 includes the display device 164 and a printer 1142.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A pattern defect detection method comprising:
    generating an image of a specimen with a scanning electron microscope;
    detecting edges of an inspection target pattern on the image;
    performing pattern matching of the inspection target pattern and a corresponding reference pattern by comparing the detected edges of the inspection target pattern with edges of the reference pattern obtained from design data of the inspection target pattern;
    calculating a brightness index value indicating a brightness of an area surrounded by detected edges of the inspection target pattern on the image;
    repeating said detecting edges, said performing pattern matching and said calculating a brightness index value, thereby building mass data containing brightness index values of inspection target patterns and corresponding reference patterns;
    determining a standard range of brightness index value based on the brightness index values contained in the mass data; and
    detecting a defect of the inspection target pattern when the calculated brightness index value is outside the standard range.

2. The pattern defect detection method according to claim 1, wherein the brightness index value is one selected from a maximum value, a minimum value, a median, an average, and a 3-sigma of brightness levels of all pixels in a region surrounded by edges of the inspection target pattern.

3. The pattern defect detection method according to claim 1, further comprising:
    classifying the inspection target patterns contained in the mass data into groups according to shapes of the reference patterns contained in the mass data,
    wherein determining the standard range comprises determining a standard range for each of the groups based on brightness index values contained in the mass data, and
    detecting the defect of the inspection target pattern comprises detecting a defect of the inspection target pattern based on whether or not a brightness index value that has been calculated for the inspection target pattern is within the standard range that has been determined for a group to which that inspection target pattern belongs.

4. The pattern defect detection method according to claim 1, further comprising producing a histogram the brightness index values, a peak point of the histogram being within the standard range.

* * * * *